(12) United States Patent
Reblewski

(10) Patent No.: US 8,346,530 B2
(45) Date of Patent: Jan. 1, 2013

(54) LOGIC DESIGN MODELING AND INTERCONNECTION

(75) Inventor: Frederic Reblewski, Paris (FR)

(73) Assignee: Mentor Graphics Corporation, Wilsonville, OR (US)

( * ) Notice: Subject to any disclaimer, the term of this patent is extended or adjusted under 35 U.S.C. 154(b) by 0 days.

(21) Appl. No.: 12/605,622

(22) Filed: Oct. 26, 2009

(65) Prior Publication Data

US 2010/0057426 A1    Mar. 4, 2010

Related U.S. Application Data

(63) Continuation of application No. 10/824,489, filed on Apr. 15, 2004, now Pat. No. 7,698,118.

(51) Int. Cl.
G06F 17/50 (2006.01)
H03K 19/20 (2006.01)

(52) U.S. Cl. .............. 703/16; 703/13; 703/14; 716/116; 326/39; 326/41

(58) Field of Classification Search ............ 703/13, 703/14, 16; 326/38–41; 716/14–15, 116
See application file for complete search history.

(56) References Cited

U.S. PATENT DOCUMENTS

| | | | | |
|---|---|---|---|---|
| 3,287,703 A | * | 11/1966 | Slotnick | 712/13 |
| 3,713,106 A | * | 1/1973 | DalMonte | 370/379 |
| 4,306,286 A | | 12/1981 | Cocke et al. | |
| 4,963,768 A | * | 10/1990 | Agrawal et al. | 326/41 |
| 5,036,473 A | * | 7/1991 | Butts et al. | 703/23 |
| 5,212,652 A | * | 5/1993 | Agrawal et al. | 326/41 |
| 5,452,446 A | * | 9/1995 | Johnson | 715/255 |
| 5,528,176 A | * | 6/1996 | Kean | 326/105 |
| 5,574,388 A | | 11/1996 | Barbier et al. | |
| 5,596,743 A | * | 1/1997 | Bhat et al. | 326/38 |
| 5,754,827 A | | 5/1998 | Barbier et al. | |
| 5,777,489 A | * | 7/1998 | Barbier et al. | 326/40 |
| 5,784,635 A | * | 7/1998 | McCallum | 715/210 |
| 5,796,623 A | | 8/1998 | Butts et al. | |
| 5,852,740 A | | 12/1998 | Estes | |
| 5,907,697 A | | 5/1999 | Barbier et al. | |
| 6,057,706 A | * | 5/2000 | Barbier et al. | 326/39 |
| 6,075,380 A | | 6/2000 | Lane | |
| 6,107,821 A | * | 8/2000 | Kelem et al. | 326/38 |
| 6,141,636 A | | 10/2000 | Sarno et al. | |
| 6,191,612 B1 | * | 2/2001 | Agrawal et al. | 326/39 |
| 6,240,376 B1 | * | 5/2001 | Raynaud et al. | 703/15 |
| 6,265,894 B1 | | 7/2001 | Reblewski et al. | |

(Continued)

OTHER PUBLICATIONS

PipeRench: A Reconfigurable Architecture and Compiler; Seth Copen Goldstein et al; IEEE Computer 2000, pp. 70-77.*

(Continued)

*Primary Examiner* — Kamini S Shah
*Assistant Examiner* — Akash Saxena
(74) *Attorney, Agent, or Firm* — Banner & Witcoff, Ltd.

(57) ABSTRACT

A dynamic reconfigurable interconnect network architecture in a logic simulation system that interconnects a plurality of simulation engines together, providing a high degree of interconnectivity in an efficient manner. The logic simulation system may create and manage linkable sub-programs for execution by a simulation engine. The logic simulation system may schedule various tasks in a design to be simulated, including horizontal and vertical partitioning of the design and determination of an order in which events such as clock edges and asynchronous signals are to be implemented by a logic simulation system.

19 Claims, 8 Drawing Sheets

U.S. PATENT DOCUMENTS

| | | | |
|---|---|---|---|
| 6,321,181 | B1 | 11/2001 | Havens |
| 6,345,240 | B1 | 2/2002 | Havens |
| 6,388,465 | B1 | 5/2002 | Barbier et al. |
| 6,448,808 | B2 | 9/2002 | Young et al. |
| 6,467,009 | B1* | 10/2002 | Winegarden et al. ......... 710/305 |
| 6,545,505 | B1 | 4/2003 | Chan et al. |
| 6,594,810 | B1 | 7/2003 | Reblewski et al. |
| 6,609,243 | B1 | 8/2003 | Evans et al. |
| 6,647,362 | B1 | 11/2003 | Reblewski et al. |
| 6,714,041 | B1* | 3/2004 | Darling et al. .................. 326/38 |
| 6,717,433 | B2 | 4/2004 | Barbier et al. |
| 6,816,826 | B1 | 11/2004 | Andersen et al. |
| 6,829,756 | B1* | 12/2004 | Trimberger ..................... 326/38 |
| 6,925,597 | B2* | 8/2005 | Anwar .......................... 715/209 |
| 6,947,882 | B1 | 9/2005 | Reblewski et al. |
| 6,993,717 | B2* | 1/2006 | Minninger .................... 715/255 |
| 6,996,504 | B2 | 2/2006 | Novotny et al. |
| 7,129,747 | B1 | 10/2006 | Jang et al. |
| 7,281,060 | B2* | 10/2007 | Hofmann et al. ............. 709/246 |
| 7,737,723 | B1* | 6/2010 | Tang et al. ...................... 326/38 |
| 2001/0049816 | A1 | 12/2001 | Rupp |
| 2002/0089349 | A1* | 7/2002 | Barbier et al. .................. 326/39 |
| 2002/0095649 | A1* | 7/2002 | Sample et al. ................... 716/12 |
| 2002/0162084 | A1 | 10/2002 | Butts et al. |
| 2003/0074178 | A1 | 4/2003 | Sample et al. |
| 2003/0131335 | A1* | 7/2003 | Hamlin ........................... 716/16 |
| 2004/0032775 | A1* | 2/2004 | Srinivasan et al. ............ 365/202 |
| 2004/0075469 | A1 | 4/2004 | Reblewski et al. |
| 2004/0181753 | A1* | 9/2004 | Michaelides ................. 715/523 |
| 2004/0194014 | A1* | 9/2004 | Anwar .......................... 715/500 |
| 2008/0046803 | A1* | 2/2008 | Beauchamp et al. ......... 715/212 |
| 2009/0106755 | A1* | 4/2009 | Chandhoke ................... 718/100 |
| 2011/0062987 | A1* | 3/2011 | Manohar et al. ................ 326/39 |

OTHER PUBLICATIONS

Email/article about variable delay with NOP, dated Apr. 28, 2004 08:07, pp. 1-3, Source: ftp://ftp.epemag.wimborne.co.uk/pub/PICS/PICtricks/ReadOut%20Aug04.txt.*

ARM User Guide web Link pp. 1-3, Source "http://www.keil.com/support/man/docs/c51/c51_nop_.htm" No date.*

Globally Asynchronous Locally Synchronous FPGA Architectures by Andrew Royal and Peter Y. K. Cheung; 2003; Citeseerx, pp. 1-10.*

* cited by examiner

LOGIC DESIGN MODELING AND INTERCONNECTION

CROSS-REFERENCE TO RELATED APPLICATIONS

This application is a continuation of and claims priority to co-pending application Ser. No. 10/824,489, filed Apr. 15, 2004, having the same title, herein incorporated by reference.

FIELD OF THE INVENTION

Aspects of the present invention are directed generally to logic design simulation, and more particularly to improved parallel reconfigurable logic processor based design simulation.

BACKGROUND

Logic simulators exist that utilize one or more processors to simulate a logic design to be emulated. At one end of the spectrum are those simulators having no parallelism. In other words, a single processor executes a program in series to simulate a design. Such simulation systems are extremely slow. At the other end of the spectrum are those simulators having a high degree of parallelism. These simulation systems have the ability to run extremely fast, as many of the tasks performed by these simulation systems may be performed simultaneously.

However, high parallelism comes at a price. First, logic simulation systems with a large number of parallel processors must find a way to interconnect the processors so that they may communicate with one another. However, the larger the number of processors, the more complex the interconnection network; the number of interconnections may rise exponentially with the number of processors. A tradeoff is to reduce the possible ways that the processors may interconnect with one another. While this reduces the cost and size of the system, it also reduces its capacity and speed.

A second price of high parallelism is network conflict. The greater the number of parallel processors, the more likely signals are going to cross and conflict with one another as they propagate through the interconnection network. Conflicts may be reduced, but not always easily prevented, especially where asynchronous signals and multiple clocks are part of the design. In such designs, it is very difficult to predict when all of the signals are to be sent; the timing tasks in the design simulation are not deterministic and must be determined on the fly during runtime.

A third priced of high parallelism is efficiency. When multiple parallel processors are used to simulate a user design, the design is divided into pieces and distributed among the processors. However, it is very difficult to distribute the design pieces without creating inefficiencies. Sometimes processors have to wait on data from other processors before continuing. This waiting not only inherently slows down the system, but also requires additional program instruction space to store wait or no-operation commands.

SUMMARY OF THE INVENTION

Aspects of the present invention are directed to defining a model for a design to be simulated. The model may be divided into one or more storage portions and one or more combinational logic portions. The model provides a robust platform from which to efficiently manage both uni-clock and multi-clock designs in an event-based environment.

Further aspects of the present invention are directed to a simulation engine that can reconfigurably implement logic and other functions in a manner consistent with the design model.

Further aspects of the present invention are directed to a dynamic reconfigurable interconnect network architecture that interconnects a plurality of simulation engines together, providing a high degree of interconnectivity in an efficient manner.

Still further aspects of the present invention are directed to creating and managing linkable sub-programs for execution by a simulation engine. Sub-programs may include portions of the design implementation itself and/or other functions such as trigger detection. This aspect may provide for a flexible subroutine-based implementation of a design, allowing for changes such as complex triggering functions without having to recompile or re-map the design.

Still further aspects of the present invention are directed to scheduling of various tasks in a design to be simulated, including horizontal and vertical partitioning of the design and determination of an order in which events such as clock edges and asynchronous signals are to be implemented by a logic simulation system.

Yet further aspects of the present invention are directed to the execution of events in a design simulation, including both scheduled events and non-deterministic asynchronous events.

BRIEF DESCRIPTION OF THE DRAWINGS

The foregoing summary of the invention, as well as the following detailed description of illustrative embodiments, is better understood when read in conjunction with the accompanying drawings, which are included by way of example, and not by way of limitation with regard to the claimed invention.

DETAILED DESCRIPTION OF ILLUSTRATIVE EMBODIMENTS

Simulation Model

Putting aside implementation for a moment, an illustrative model is now described that may be particularly effective in dealing complex designs. However, the model may be utilized for any design, including single-clock designs with or without asynchronous signals.

Figure 1:
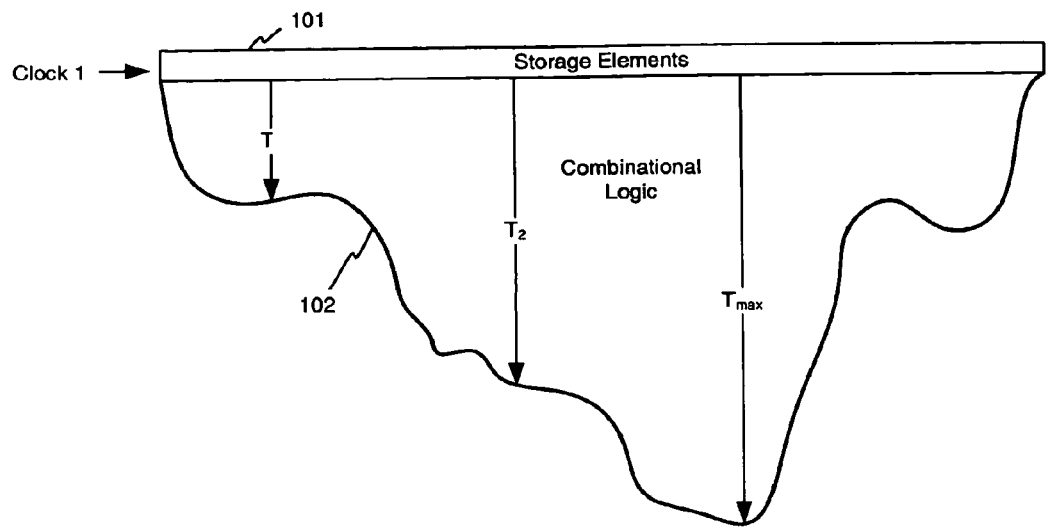
FIGS. 1 and 2 show an abstraction of an illustrative simulation model in accordance with at least one aspect of the present invention.

An illustrative user design is now described with reference to FIG. 1. A typical design has one or more registers. Combination logic may be interconnected between the registers. FIG. 1 illustrates this concept in the abstract. A plurality of storage elements 101, which may be, e.g., flip-flops, latches, and/or registers, may be responsive to a clock, Clock 1. Combinational logic 102 may be coupled to the plurality of storage elements 101. Logic signals may propagate through the combination logic 102 via a plurality of data paths. The horizontal dimension of FIG. 1 represents a cross section of the various flip-flip flops and data paths in the design. The vertical dimension of FIG. 1 represents the time for data to pass through the data paths. Thus, in this functional depiction, logic signals may travel from respective ones of the storage elements 101 down vertically through the combinational logic 102 until the end of the combination logic 102 is reached. Responsive to Clock 1, logic signals may be received by the storage elements 101. Also responsive to Clock 1, logic signals may be presented at the outputs of the storage elements 101. The logic signals presented at the outputs of the storage elements 101 may travel (vertically down in FIG. 1) through the combinational logic 102 until they reach the end of the respective data paths (the bottom perimeter of the combination logic 102 in FIG. 1). Once the logic signals have completed propagating through respective portions of the combinational logic 102, the resulting logic signals may be then fed back into inputs of one or more of the storage elements 101.

Each data path in the combinational logic 102 may take a particular time T for logic signals to pass through. For example, a first data path may take time $T_1$, and a second data path may take time $T_2$. The longest path is shown to take a time of $T_{max}$. Typically in a design, Clock 1 is set to a frequency no greater than, and indeed usually less than, $1/T_{max}$. This allows time for the logic signals to propagate fully through all of the data paths and be received by the flop-flops 101 in time for the next Clock 1 cycle.

Figure 2:
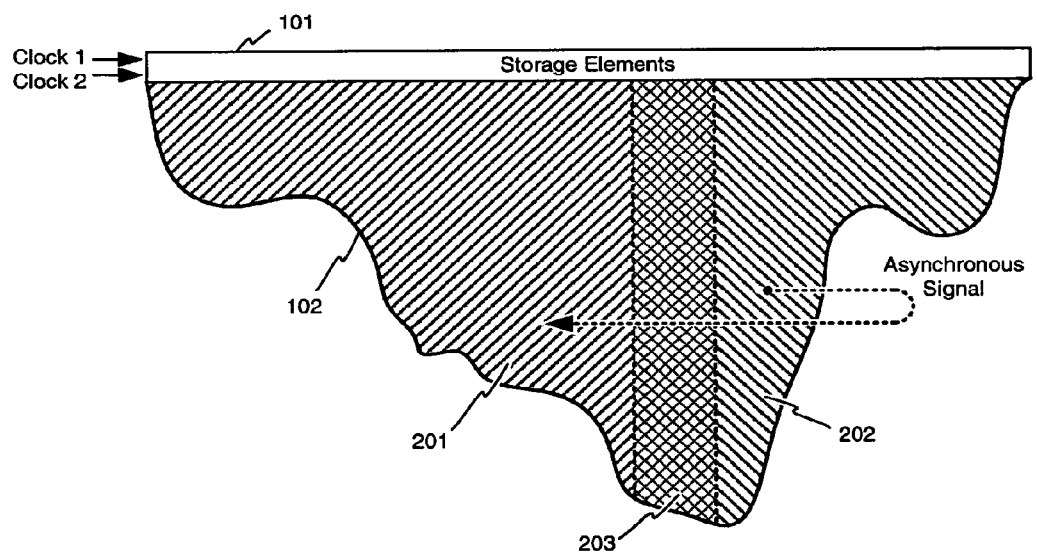

Now, adding a level of complexity, assume that the design also has a second clock, Clock 2. A design may utilize one or more clocks for clocking elements of the design. For example, a design may use a first clock and a second clock. The various clocks may have different phases and/or different periods. A design may also utilize asynchronous events—events that occur regardless of the clock(s). Referring to FIG. 2, the shaded portion 201 in FIG. 2 refers to the portion of the combinational logic 102 that contains Clock 1 data paths. A Clock 1 data path is a data path that receives a logic signal from a flip-flop 101 that is clocked by Clock 1. Similarly, a Clock 2 data path is a data path that receives a logic signal from a flip-flop 101 that is clocked by Clock 2. The shaded portion 202 refers to the portion of the combinational logic 102 that contains Clock 2 data paths.

It is possible in some designs that each data path of the combinational logic 102 is either a Clock 1 data path or a Clock 2 data path. However, the more likely scenario is that a design will utilize some interconnection between Clock 1 data paths and Clock 2 data paths. This situation is illustrated as the portion 203 where portions 201 and 202 overlap. This situation is also more complex to simulate.

Figure 3:
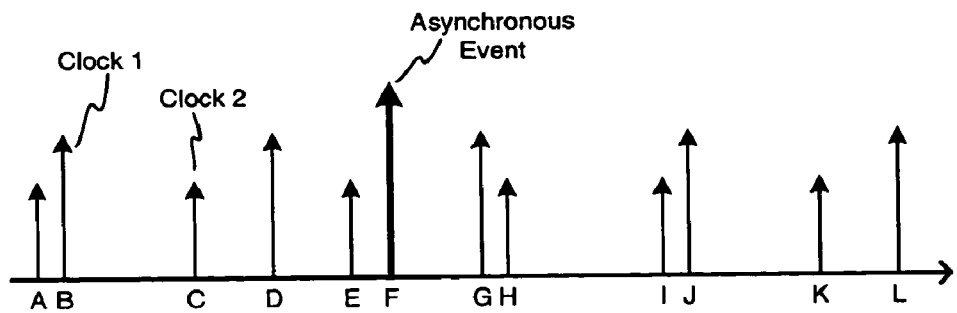
FIG. 3 is an illustrative timing diagram showing an asynchronous event in accordance with at least one aspect of the present invention.

To add still further complexity, consider that one or more portions of the combinational logic 102 may be responsive to one or more asynchronous signals. An asynchronous signal is a signal that may occur at a time irrespective of a clock signal. For example, referring to FIG. 3, illustrative timings of Clock 1 and Clock 2 edges A, B, C, D, E, G, H, I, J, K, and L are shown, as well as the timing of an asynchronous signal F. As can be seen, the asynchronous signal does not necessarily occur simultaneously with a clock signal.

Continuing with the model, assume for the moment that the time T required for logic signals to propagate through the combinational logic 102 is always zero. In other words, as soon as a logic signal is presented at the output of one of the storage elements 101, that logic signal is simultaneously propagated through a data path of the combinational logic 102 and simultaneously presented at an input of one or more of the storage elements 101. By assuming for the moment that signals propagate through the combinational logic 102 instantaneously, it turns out that the only times at which logic signals would need to be evaluated are at clock edges and asynchronous events (i.e., at moments when one or more of the storage elements 101 produces a valid output). Such a zero-propagation-time assumption also results in those portions of the design that include interconnections between Clock 1 and Clock 2 data paths becoming much easier to model.

Because the timing of various signals within a clock cycle would be irrelevant, asynchronous signals (e.g., sets and resets) may also more easily be modeled. Each design clock edge, and each asynchronous signal, may thus be considered a relevant event. Thus, the model is now dealing with a successive series of events. Thus, the chronological order of the events becomes relevant. Multiple clocks and asynchronous events are now handled with ease. It is simply a matter of determining in which order the events will occur. Because of this, the present model may be referred to as an event-driven model. From the model perspective, the time between events (not to be confused with the speed and timing of the actual implementation/simulation of the model) is no longer relevant.

Figure 4:
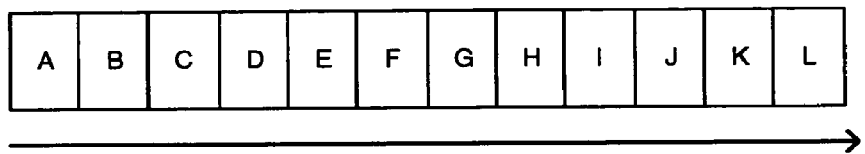
FIG. 4 shows an illustrative ordered series of events in accordance with at least one aspect of the present invention.

To provide an example of a series of events, the timing diagram of FIG. 3 may be reduced to the series of events A through L shown in FIG. 4. Because the relative timing of clock edges (e.g., edges of Clock 1 and Clock 2) are known beforehand, the order of clock events (e.g., events A, B, C, and D) may also be determined beforehand. Thus, the order of clock events may be deterministic and may therefore be pre-scheduled. Asynchronous events, on the other hand, are typically not known beforehand. This is because many asynchronous events are responsive to outside signals, such as a reset function or user input. As far as the design is concerned, such asynchronous signals may come at unpredictable times.

Thus, asynchronous events may not to be treated as deterministic events and may therefore not be scheduled. Conventional simulators, by contrast, were required to treat asynchronous events as deterministic events. The present model is not so limited.

Thus, it can be seen that simulating a design can be complex, especially where the design has multiple clocks and is responsive to asynchronous signals. However, simulators do not simulate an actual design. Instead, they simulate a model of the design, and the way that the model is defined can affect the complexity of the simulation.

Simulation Engines

A user design may be simulated, or implemented, by a plurality of parallel interconnected simulation engines. For example, a logic simulation system may include thousands of interconnected simulation engines running in parallel. Each simulation engine may include a microprocessor, instruction memory, and/or data memory. Each simulation engine may be considered a reconfigurable logic processor, in that the simulation engine 500 may be configured to evaluate truth tables (e.g., Boolean functions such as AND and OR logic functions), operators (e.g., addition, subtraction, multiplication, division, etc.), and/or memory operations. For example, a simulation engine may be configured to perform, at a given moment, a logical AND function on a plurality of binary inputs, or configured to perform a logical OR function on the plurality of inputs.

Figure 5:
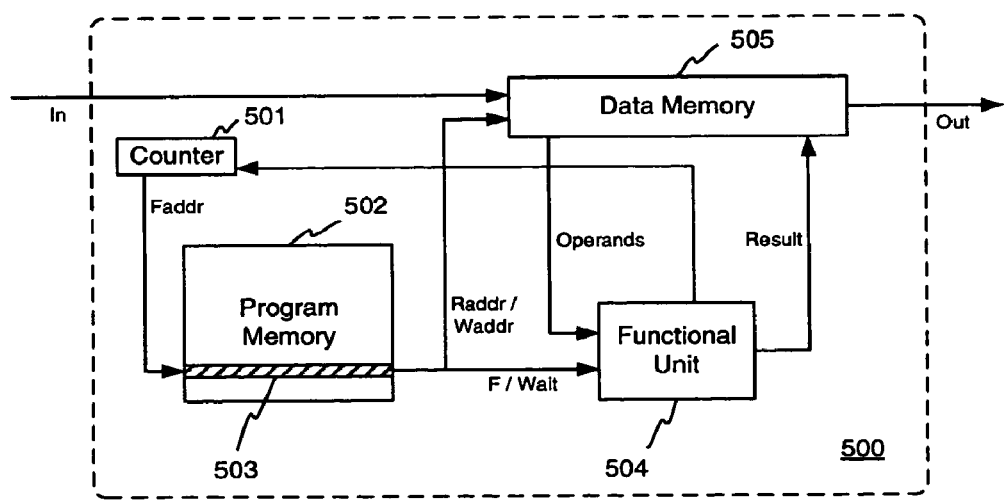
FIG. 5 is a functional block diagram of an illustrative simulation engine in accordance with at least one aspect of the present invention.

An illustrative simulation engine 500 is shown in FIG. 5. The simulation engine 500 may be configured in accordance with a set of instructions that are stored in a program memory 502. The instructions may be run through in a defined order (as in a program) in accordance with an instruction pointer defined by a counter 501. The counter 501 may control the instruction pointer to increment through a series of addresses Faddr that store a set of instructions (e.g., including instruction 503) from the program memory 502. The simulation engine 500 may further include a data memory 505 for storing inputs that are provided to the simulation engine 500, for storing working data, and/or for storing results of its operations. A functional unit 504 may perform the configured function in accordance with the instructions that are read out in series from the program memory 503.

Figure 6:
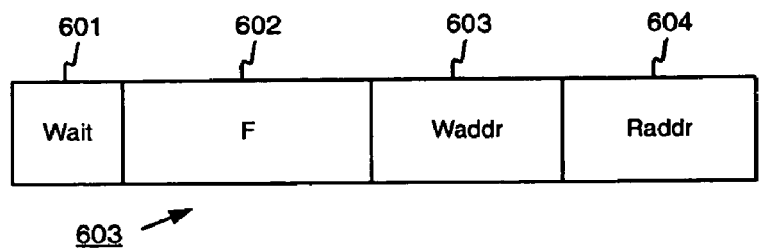
FIG. 6 shows an illustrative instruction that may be used by a simulation engine, in accordance with at least one aspect of the present invention.

Referring to FIG. 6, an illustrative embodiment of the instruction 503 is shown. The instruction 503, like the other instructions in the program memory 502, may include wait data 601, function data 602, write address 603, and/or read address 604. The function data 602 identifies the particular logical function to be performed by the functional unit 504, e.g., an AND operation, an OR operation, and/or any other simple or complex function. The wait data 601 instructs the functional unit 504 to wait for an amount of time corresponding to the wait data 601 prior to commanding the counter 501 to increment to the next instruction. By including a command to wait in the same instruction 503 as the function data 602, space in the program memory 502 may be used more efficiently. In other words, it is not necessary to define and store a separate "no operation" instruction that effectively is merely useful for inserting a delay.

Figure 7:
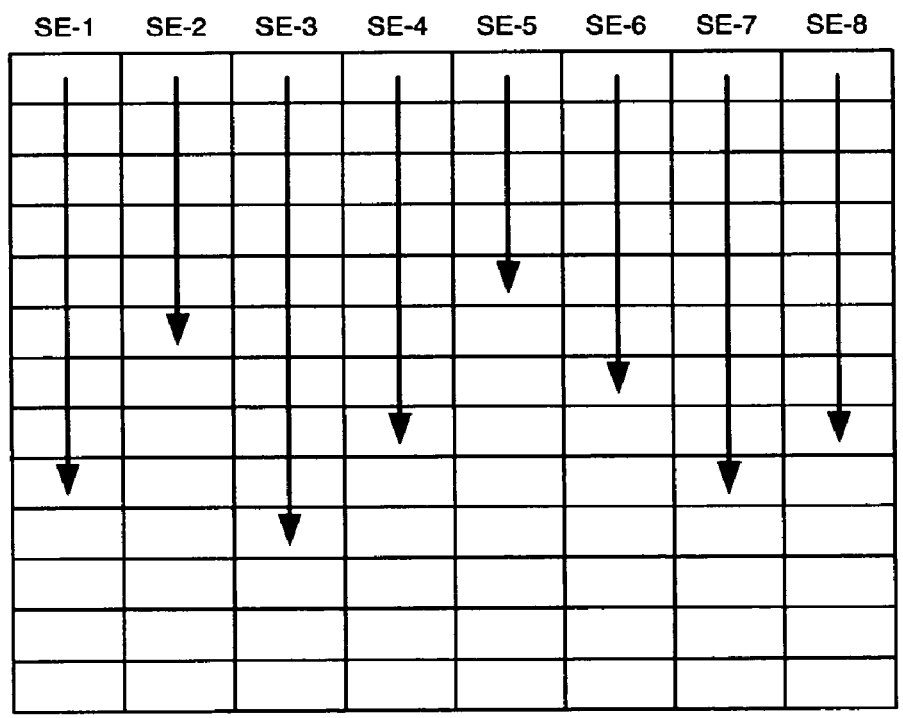
FIG. 7 is a table showing illustrative individual instruction pointers for each of a plurality of simulation engines, in accordance with at least one aspect of the present invention.

When the simulation engine 500 is in operation, an instruction stored in the program memory 502 (identified by the counter 501 as being stored in address Faddr of the program memory 502) may instruct the functional unit 504 to perform an AND function (for example), as indicated by the function data F 602, on a plurality of operands. The plurality of operands may be received by and stored in the data memory 505. The functional unit 504 may read the operands from address Raddr of the data memory 505. The functional unit 504 may further perform the function defined by the function data F 602 on the operands and store the result of the function F in address Waddr of the data memory 505. The result may further be output from the simulation engine 500. The function unit 504 may further wait a certain amount of time, if any, in accordance with the wait data 601, and then instruct the counter 501 to increment to the next address Faddr. Referring to FIG. 7, in a simulation system having a plurality of simulation engines, each simulation engine may have its own independent instruction pointer. Thus, each simulation engine is free to execute instructions as fast at it can. An illustrative architecture of how the simulation engines may form a larger simulation system will be discussed in more detail below.

Interconnection Architecture

Figure 8:
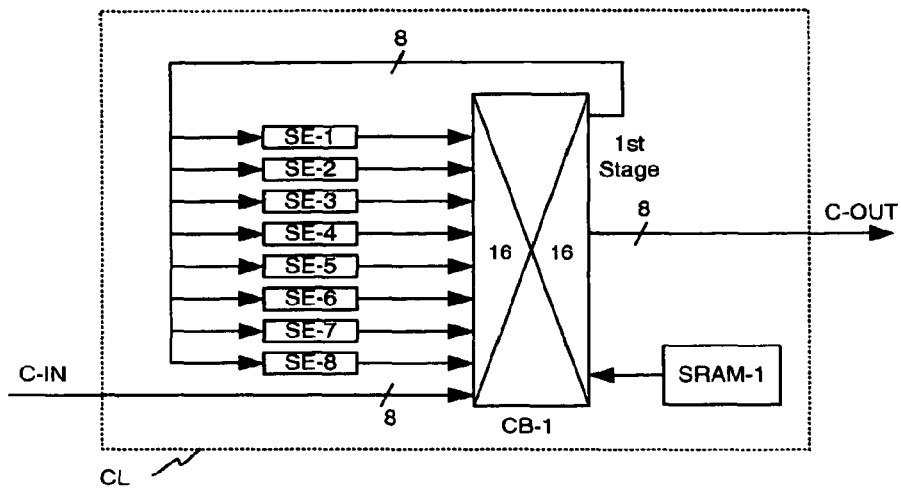
FIG. 8 is a functional block diagram of an illustrative simulation engine cluster in accordance with at least one aspect of the present invention.

Referring to FIG. 8, subsets of simulation engines may be organized into one or more clusters, such as illustrative cluster CL, which includes a subset of simulation engines SE-1 to SE-8. Although a subset of eight simulation engines are shown in this example, the cluster CL may contain any number of a plurality of simulation engines, such as at least four simulation engines, at least eight simulation engines, or at least twenty simulation engines. Each simulation engine SE-1 to SE-8 may be reconfigurable to evaluate truth tables (e.g., AND, OR), operators (e.g., addition, multiplication), and/or memory operations. As discussed previously, the simulation engines SE-1 to SE-8 may each include a processor to perform such evaluations. The processors may operate in response to sets of instructions, which may be generated by a compiler.

The simulation engines SE-1 to SE-8 in the cluster CL may each have an output coupled to an input of a first reconfigurable interconnect stage such as at least one crossbar CB-1. The crossbar CB-1 may further receive one or more inputs from a cluster input C-IN from a source external to the cluster CL. Other types of interconnect stages may be used, such as multiplexors, swappers, and/or switches.

The crossbar CB-1 may have a plurality of outputs each coupled back to an input of a respective one of the simulation engines SE-1 to SE-8. Further outputs of the crossbar CB-1 may be coupled to a cluster output C-OUT that may be coupled to a recipient outside of the cluster. In the shown example, the crossbar CB-1 is a 16×16 crossbar, meaning that it has sixteen inputs and sixteen outputs. However, the crossbar CB-1 may have other numbers of inputs and outputs. Preferably, there are at least twice as many inputs as there are simulation engines coupled to the crossbar CB-1. This allows for the same number of C-IN signals (eight, in the present example) as there are simulation engines (eight, in this example) in the cluster CL.

A plurality of clusters CL may be interconnected to form a larger interconnection network, such as a dynamic multi-stage interconnection network. For example, referring to FIG. 9, a plurality of clusters CL-1 to CL-8 may be interconnected in an emulation system 900. Although eight clusters are shown in this example, any number of clusters may be interconnected. Each of the clusters CL-1 to CL-8 may be configured as discussed previously with regard to FIG. 8. Each of the clusters CL-1 to CL-8 may be coupled to a second reconfigurable interconnect stage, such as at least one crossbar. In the shown example, outputs of each of the clusters CL-1 to CL-8 are coupled to inputs of respective crossbars CB-2-1 to CB-2-8. The crossbars CB-2-1 to CB-2-8 together make up a second level, or stage, of reconfigurable interconnects.

The second stage of crossbars CB-2-1 to CB-2-8 each may have outputs feeding back to the "IN" inputs of the clusters. The second stage of crossbars CB-2-1 to CB-2-8 each may further have outputs feeding into a plurality of third reconfigurable interconnect stage, in this example crossbars CB-3-1 to CB-3-8. The large X between the second and third stages is intended to represent butterfly topology interconnectivity between the stages. In other words, each of the crossbars CB-2-1 to CB-2-8 has at least one output feeding into an input of each of the crossbars CB-3-1 to CB-3-8. Thus, for example, a first output of CB-2-1 may feed into an input of CB-3-1, a second output of CB-2-1 may feed into an input of CB-3-2, a third output of CB-2-1 may feed into an input of CB-3-3, and so on. Although butterfly interconnectivity between the second stage to the third stage of reconfigurable interconnects is shown in this example, partial or full interconnectivity may alternatively be used.

The third stage of crossbars CB-3-1 to CB-3-8 each may have outputs feeding back to inputs of the second stage of crossbars CB-2-1 to CB-2-8. For example, crossbar CB-3-1 may have a plurality of outputs (in this example, eight) feeding back into a plurality of inputs (in this example, eight) of CB-2-1.

Some or all of the crossbars CB-2-1 to CB-2-8 and CB-3-1 to CB-3-8 may be dynamically reconfigurable. That is, they may be reconfigurable from clock cycle to clock cycle. Configuration information may be stored in one or more memories, such as SRAMs or other types of memories. In the shown example, SRAM-1, SRAM-2, and SRAM-3 may store configuration information for the first, second, and third stages of crossbars, respectively. SRAM-1, SRAM-2, and SRAM-3 may each store different configuration information for each of a plurality of clock cycles. For each clock cycle (or for certain of the clock cycles), the configuration information associated with that clock cycle may be forwarded to the appropriate ones of the crossbars CB-1, CB-2-1 to CB-2-8, and/or CB-3-1 to CB-3-8, which may use the configuration information to configure the interconnections within the crossbars for that clock cycle. For example, SRAM-1, SRAM-2, and/or SRAM-3 may contain first configuration information associated with a first clock cycle, and second configuration information associated with a second clock cycle. During the first clock cycle, some or all of the crossbars CB-1, CB-2-1 to CB-2-8 and CB-3-1 to CB-3-8 may be reconfigured to have a first interconnect configuration corresponding to the first configuration information. And during the second clock cycle, some or all of the crossbars CB-1, CB-2-1 to CB-2-8 and/or CB-3-1 to CB-3-8 may be reconfigured to have a second interconnect configuration corresponding to the second configuration information.

A potential advantage of such a system 900 is that although only three stages of crossbars are used (in this example) to interconnect the clusters CL-1 to CL-8, it may appear to some data paths as though there are really four stages of crossbars. This may be due to the feedback paths between the second stage and the clusters CL-1 to CL-8, the feedback paths between the third stage and the second stage, and/or the feedback paths within the clusters CL-1 to CL-8 as shown in FIG. 8. By using one or more of these types of feedback paths, a three stage interconnect system may be utilized that is nearly as flexible, or just as flexible, as a four stage interconnect system. Also by using one or more of these types of feedback paths, it is likely that shorter paths, and even the shortest possible paths, may be used to forward data through the emulation system 900.

An example of the system 900 in operation will aid in its understanding. Assume, for example, that simulation engine SE-3 (FIG. 8) of cluster CL-2 (FIG. 9) needs to send data to simulation engine SE-8 of cluster CL-2. The data can take one of several paths, but the shortest path in the illustrative embodiment would be very short: through the cluster crossbar CB-1 of cluster CL-2, and then fed back into the input of simulation engine SE-8 of cluster CL-2.

As another example, assume that simulation engine SE-3 of cluster CL-2 now needs to send data to simulation engine SE-8 of cluster CL-8. The shortest path in the illustrative embodiment would be through the crossbar CB-1 of cluster CL-2, then out to the second stage crossbar CB-2-2, then to the third stage crossbar CB-3-8, then back to the second stage crossbar CB-2-8 (which is thus also acting as a fourth stage), and then into the input of simulation engine SE-8 of cluster CL-8. Thus, in this example, the data signal passes through the second stage, then the third stage, and then the second stage again, effectively using the second stage twice, both as a second stage and as a fourth stage. Thus, the flexibility of a four-stage interconnect may be obtained with only three physical stages.

In the shown embodiment, feedback paths are provided within the clusters CL-1 to CL-8, from the second stage to the clusters, and from the third stage to the second stage. However, not all of these feedback paths are necessary. Also, different feedback paths may be used, such as between the third stage and the clusters. Also, the shown embodiment may be extended to additional stages (e.g., four physical stages, or five physical stages, or more), with additional feedback paths being provided between various stages and/or between stages and clusters.

Figure 10:
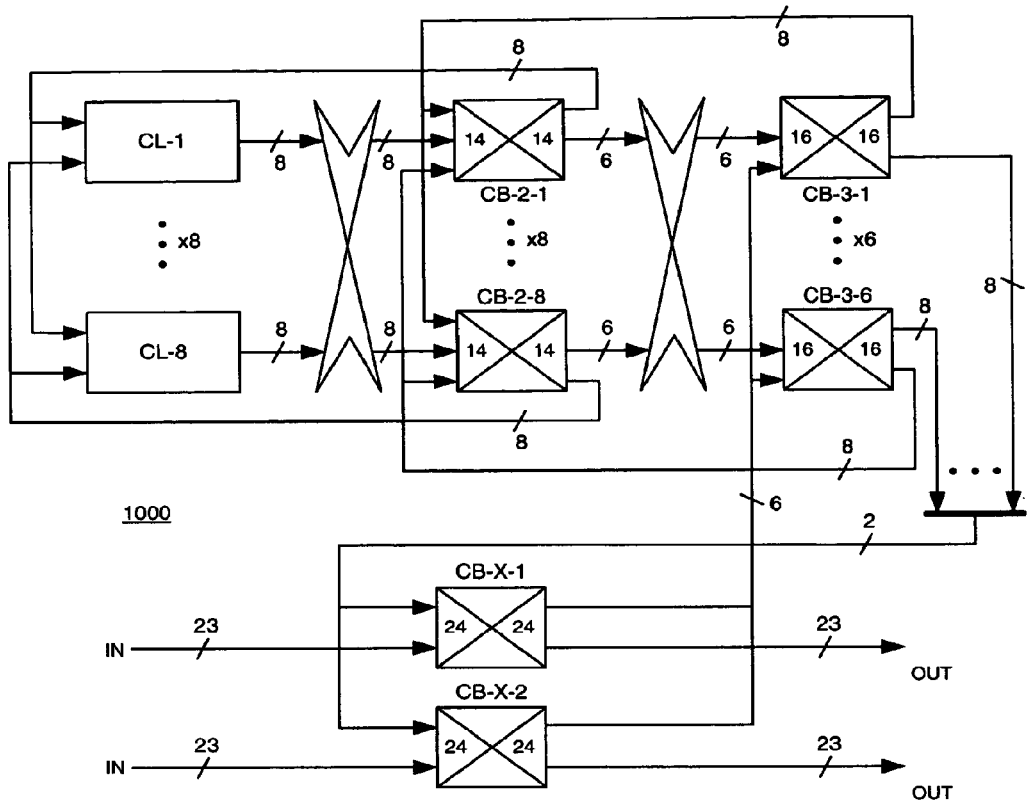

Referring to FIG. 10 showing another illustrative embodiment of an emulation system 1000, each of the clusters CL-1 to CL-8 may be directly coupled to a plurality of the second stage crossbars CB-2-1 to CB-2-8. This differs from the system 900 where the clusters CL-1 to CL-8 were directly coupled only to a single respective one of the second stage crossbars CB-2-1 to CB-2-8. For example, in the system 1000, cluster CL-1 may have a first output coupled to an input of crossbar CB-2-1, a second output coupled to an input of crossbar CB-2-2, and so on. This may provide even more flexibility in assigning data paths between simulation engines.

As shown in the embodiment of FIG. 10, one or more additional reconfigurable interconnects such as crossbars CB-X-1 and CB-X-2 may be used to couple IN and OUT signal lines with the emulation system 1000. The IN and OUT signal lines of system 1000 may provide communication externally to the system 1000. In the embodiment shown, the IN signal lines are reconfigurably connected with inputs to third stage crossbars CB-3-1 to C-B-3-6. However, the IN signal lines may be reconfigurably or non-reconfigurably connected to other portions of the system 1000, such as inputs of second stage crossbars CB-2-1 to CB-2-8. The outputs of third stage crossbars CB-3-1 to CB-3-6 are shown to be reconfigurably connected to the OUT lines. However, other portions of the system 1000 may be reconfigurably or non-reconfigurably connected to the OUT lines, such as outputs of second stage crossbars CB-2-1 to CB-2-8. The crossbars CB-X-1 and/or CB-X-2 may also be used in conjunction with system 900.

Figure 9:
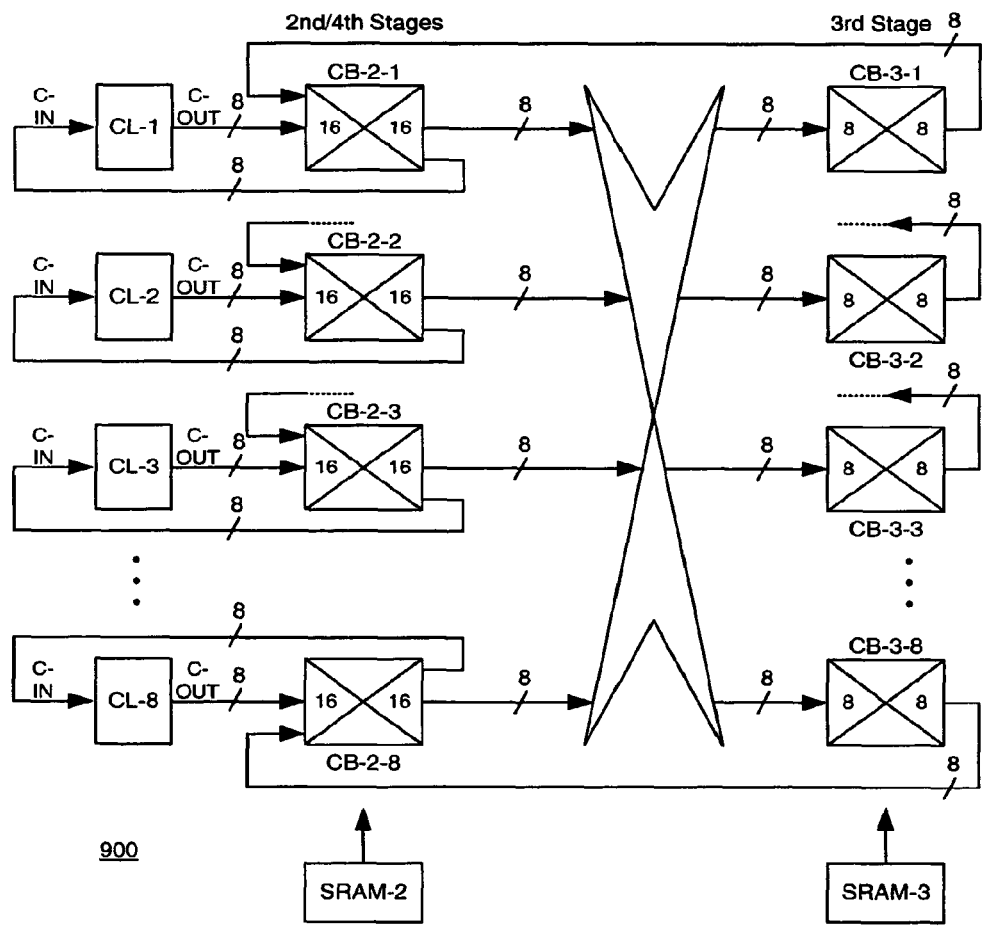
FIGS. 9 and 10 are functional block diagrams of illustrative interconnection networks in accordance with at least one aspect of the present invention.

In some embodiments, the emulation system 1000 (or system 900) may be part of a larger emulation system, such that the elements shown in FIG. 10 may be, for example, disposed on a single circuit board, with the larger system having a plurality of these circuit boards having elements similar or identical to those shown in FIG. 10 (or FIG. 9). In such embodiments, the IN and OUT signals lines of system 1000 (or 900) may be used to communicate with other circuit boards. The architecture shown in FIGS. 8, 9, and 10 may be embodied on a single integrated circuit or may be distributed among a plurality of integrated circuits.

Scheduling

Figure 11:
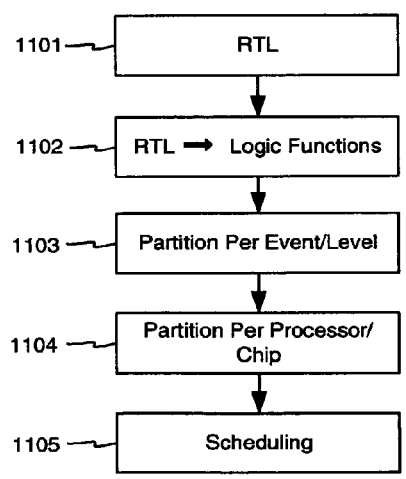
FIG. 11 is a flowchart showing illustrative steps for translating and partitioning a user design in accordance with at least one aspect of the present invention.
Figure 12:
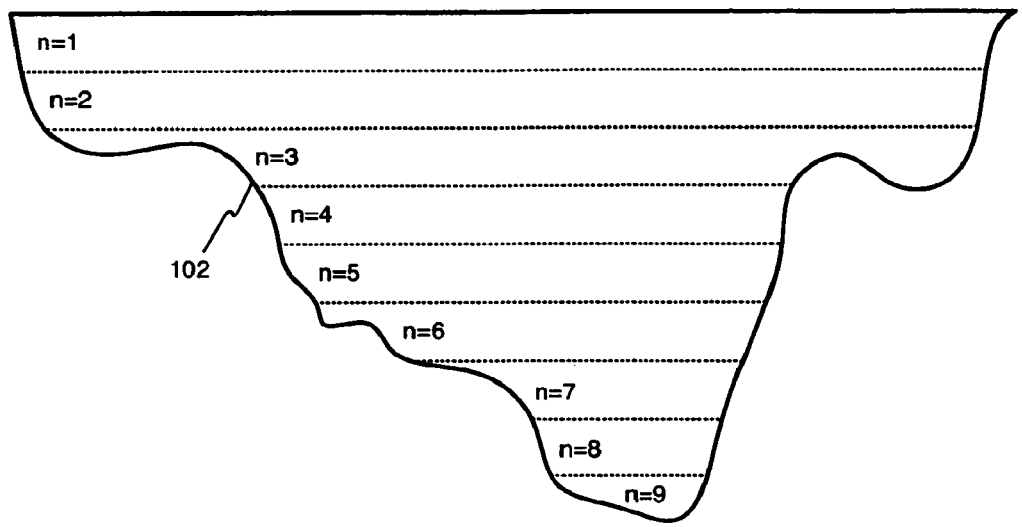
FIG. 12 is an abstraction of a user design being illustratively horizontally partitioned in accordance with at least one aspect of the present invention.

A design may be viewed as a set of tasks, some of which may be executed in parallel. To determine which tasks are executed in parallel, which are executed in series, and in what order they are executed, the design may be sliced into pieces and those pieces may be ranked and grouped. More particularly, and referring to FIG. 11, a software compiler/scheduler may receive a design description, such as in register transfer language (RTL) (step 1101), and translate the design description into a set of logic functions (step 1102). Next, the software compiler may partition the logic functions of the design into a plurality of levels (step 1103). This will be referred to herein as "horizontal partitioning." Each level represents a different event during runtime (i.e., during simulation). FIG. 12 shows an example of the combinational logic 102 being horizontally partitioned into a plurality of levels. In the shown embodiment, the combinational logic 102 is partitioned into nine levels (n=1 through n=9). However, any number of levels may be created. In general, the level of a combinational logic element depends upon how many prior combinational logic elements its longest input path passes through. The length of an input path is the number of combinational logic elements that the path passes through.

Figure 13:
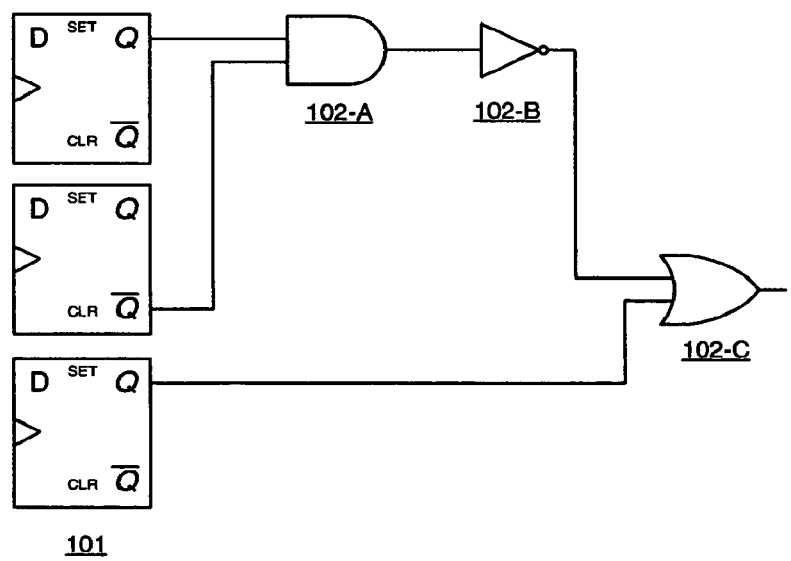
FIG. 13 is a schematic diagram of an illustrative user design that may be partitioned, in accordance with at least one aspect of the present invention.

For instance, using the illustrative notation of FIG. 12, a design combinational logic element in the design combinational logic 102 may be at the nth level if its longest input path from the storage elements 101 passes through n−1 other combinational logic elements prior to reaching the combinational logic element. For example, referring to FIG. 13, an illustrative portion from a design is shown. In particular, the portion shown includes three flip-flops that are part of storage elements 101, an AND gate 102-A, an inverter 102-B, and an OR gate 102-C coupled together. In this example, the AND gate 102-A would be at the first level (n=1) since its longest input path passes through (n−1=1−1=0) prior combinational logic elements. The inverter 102-B would be at the second level (n=2) since its longest input path passes through the AND gate 102-A, and thus through (n−1=2−1=1) prior combinational logic element. The OR gate 102-C would be at the third level (n=3) since its longest input path passes through the AND gate 102-A and the inverter 102-B, and thus through (n−1=3−1=2) prior combinational logic elements.

Figure 14:
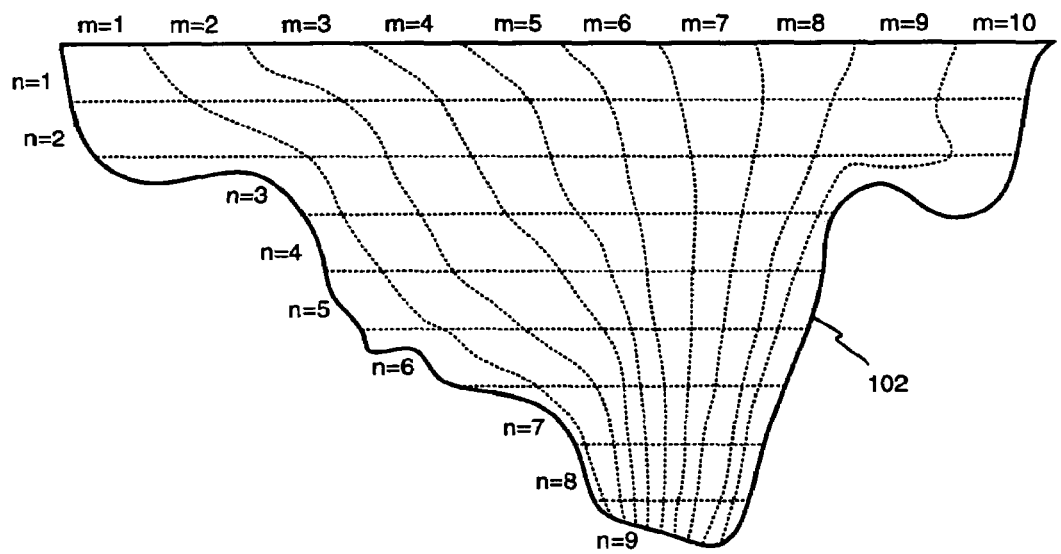
FIG. 14 is an abstraction of the user design of FIG. 12 being also illustratively vertically partitioned in accordance with at least one aspect of the present invention.

Referring back to FIG. 11, the software compiler may further partition the design across a plurality of simulation engines, clusters, integrated circuits, and/or boards (step 1104). This will be referred to herein as "vertical partitioning." In general, when partitioning in this way, it may be desirable to maximize the intra-connections within each partition and to minimize the interconnections between partitions. It may further be desirable to balance the sizes of the partitions by level. In other words, for each given level n, all of the partitions in that level may be generated so as to be of the same size or substantially the same size. In other words, the number of combinational logic functions within each partition of a given layer should be approximately the same. This may allow the parallel simulation system to run at a higher speed. An example of such balanced vertical partitioning in step 1104 is illustrated in FIG. 14, showing the combinational logic N02 being divided into ten vertical partitions m1 through m10. Thus, in the shown example, there are nine horizontal partitions and ten vertical partitions, for a total of ninety partitions. This is of course a simple example; designs may often be expected to be partitioned into many thousands of partitions or more.

Figure 15:
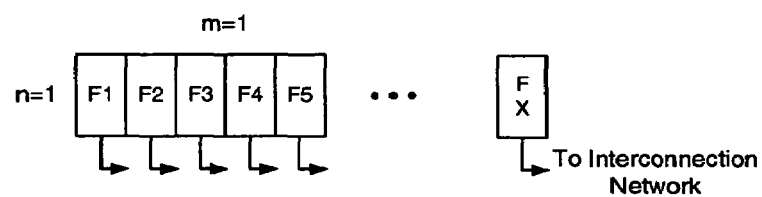
FIG. 15 is an illustrative zoomed-in view of a partition from FIG. 14, in accordance with at least one aspect of the present invention.

Each partition may include a plurality of logical functions to be performed. For example, referring to FIG. 15, the partition at n=1, m=1 (i.e., the upper left partition in FIG. 14), also referred to as partition (n=1, m=1), is shown to include a total of X functions, from function F1 through function FX. Each function F may represent a logic gate such as an AND gate or an OR gate or any other simple or complex logic function that may be represented by a truth table, or a memory function such as a read or write function. For instance, function F1 may be a NAND logic function, function F2 may be an inversion function, and function F3 may be an addition function. The output of each function may be forwarded to the next destination through an interconnection network such as the interconnection networks 900 or 1000. The next destination may be one or more other partitions in the combinational logic (each having a level n greater than the level of the current function) and/or one or more of the storage elements 101.

Each of the functions within a particular partition (n, m) may be executed by a single simulation engine, by a single cluster of simulation engines, by a single integrated circuit of simulation engines, or by a single board of simulation engines. For the present example, it will be assumed that all functions within a single partition (n, m) are executed by a single simulation engine. Also, all of the functions within a particular level n may be executed prior to executing functions at a next level n+1. In other words, to ensure that all input operands to the functions defined at level n+1 are available, execution of level n+1 should preferably wait until the previous level n has completed execution. In addition, execution of level n+1 may further wait a period of time to allow results of level n execution to propagate through the interconnection network to their destinations.

Each function F may be associated with its own delay through the network to its respective destination. For example, the output of function F1 may require t1 amount of time to reach its destination, and the output of function F2 may require t2 amount of time to reach its destination, where t1 and t2 may be the same or different. This is because at least some of the outputs of the function may pass through differing numbers of stages in the interconnection network, and each stage may impose a delay. For instance, the output of function F1 may be generated by a simulation engine in a cluster, and the destination of that function may be a simulation engine within the same cluster. In such a case, the output of function F1 may pass through only a single stage (e.g., the crossbar CB-1) of the interconnection network. On the other hand, the output of function F2 may be generated by the same simulation engine, but its destination may be a simulation engine in a different cluster. In that case, the output of function F2 may pass through multiple stages of the interconnection network.

The delay through the interconnection network may be taken into account to determine the order in which the functions F1 through FX are executed. Since a level n+1 is not executed until the results of previous level n have completed and propagated to their respective destinations, the order of the functions can affect the overall speed of the simulation system. If the first executed functions F1, F2, F3, etc. are associated with very short interconnection delays at their outputs, and the later executed functions FX-1, FX, etc. are associated with lengthy interconnection delays, then the total time that it takes to execute functions and propagate their results is longer than necessary. Because the present system is deterministic, i.e., the mappings of the functions and interconnects are known prior to runtime, the functions may be ordered advantageously to reduce or minimize the amount of time. Optimally, the functions may be ordered according to their respective interconnection network delay times. For example, the shorter the associated interconnection network delay, the earlier that function is executed.

The interconnection delay associated with each function may further be taken into account to ensure that two outputs do not connect to the same destination at the same time. Such an occurrence would be a conflict, and the result could be failure of the simulation. For example, assume that the interconnection network delays a first signal by routing that signal through three interconnection stages, and a second signal is routed through only two interconnection stages. Further assume that the first signal is generated before the second signal, and that both signals have the same destination. It is possible that, due to the difference in interconnection network delay times, the first and second signals might arrive simultaneously, or at least within a same simulator clock cycle, at the same destination. Thus, the relative network delays may preferably be accounted for to predict and avoid such network conflicts.

Event Processing

Figure 16:
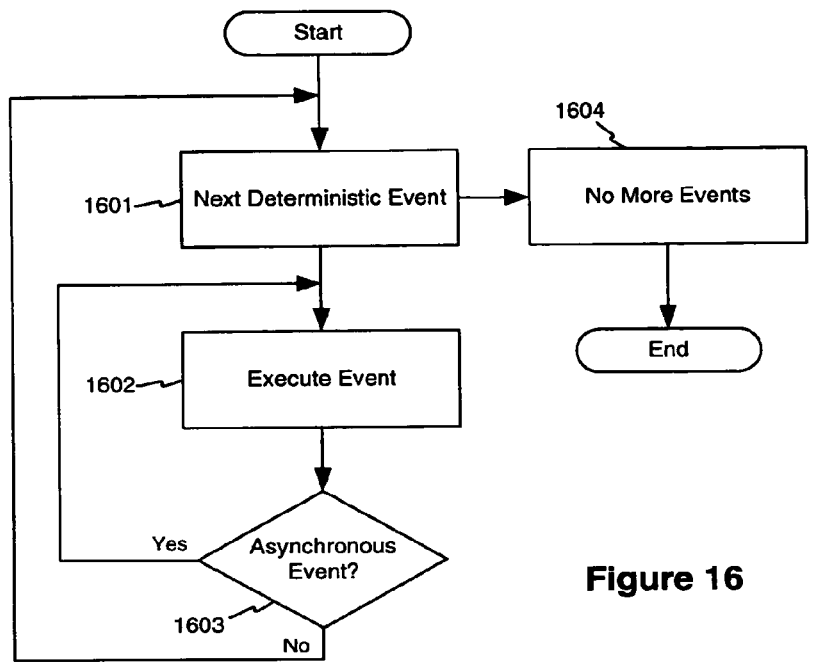
FIG. 16 is a flowchart showing illustrative steps for executing events in accordance with at least one aspect of the present invention.

An illustrative method for processing and executing both deterministic and asynchronous events is shown in FIG. 16. The first or next scheduled deterministic event (e.g., a clock edge event) in the series is determined (step 1601). That deterministic event is then executed by the simulator to evaluate logic signals in the design model (step 1602). Next, it is determined whether an unscheduled asynchronous event exists (step 1603). Since asynchronous events are typically non-deterministic, their existence must be determined. If there is an asynchronous event, then that asynchronous event is executed (step 1602). If there is no asynchronous event, then the next deterministic event is found and that next deterministic event is executed (step 1602). This process repeats until there are no more events to execute (step 1604).

Linkable Logic Analysis and Event Processing

Figure 17:
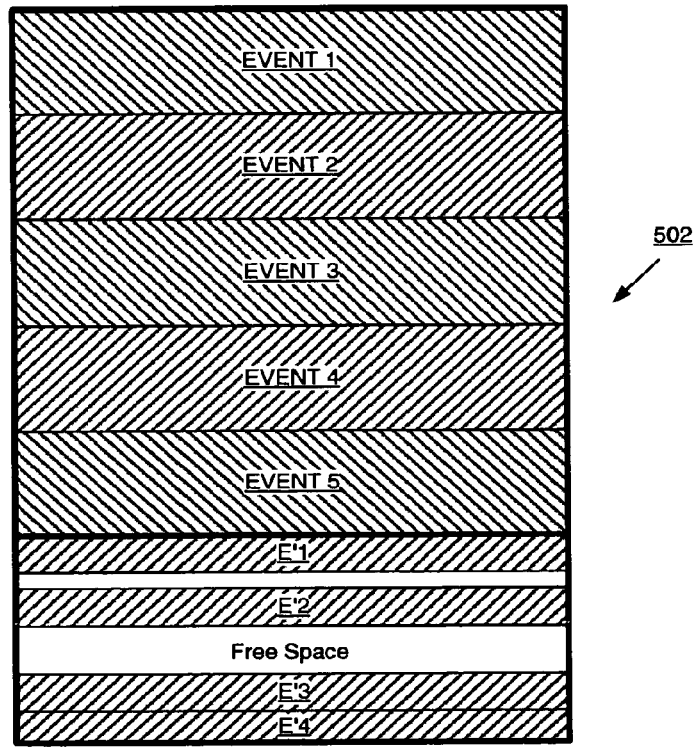
FIG. 17 is a table of illustrative macro events in accordance with at least one aspect of the present invention.

Because each simulation engine may be configured to simulate a portion of the design that is larger than a single logic function, each event may cause a plurality of simulation engine tasks, or instructions, to be executed. Referring to FIG. 17, the program memory 502 of the simulation engine 500 may therefore store instructions grouped into a plurality of subprograms each corresponding to a different event (e.g., events 1 through 5). The program memory 502 may further store a plurality of links, e.g., links E1 through E4, each of which contains, or otherwise directly or indirectly refers to, the address Faddr of the first instruction of one of the subprograms. In operation, each simulation engine (e.g., simulation engine 500) may execute a subprogram (e.g., the subprogram for event 1), and then stop.

The simulation engine may run a logic analyzer subprogram that may determine, in accordance with one of the stored links (e.g., link E1), which subprogram to execute next. For example, link E1 may point to the subprogram for event 2, and so once the subprogram for event 1 is executed and completed, then the subprogram for event 2 would be executed. Thus, the functional unit 504 may reset the instruction pointer (as stored in the counter 501) to the linked-to address Faddr of the next scheduled subprogram. This executing-stopping-linking-executing pattern may continue and be repeated throughout a simulation run.

The logic analyzer subprogram may be compiled by the compiler at the time that the design itself is compiled from netlists. Thus, the program memory 502 may include some subprograms that represent portions of the design to be emulated, along with one or more other subprograms that represent the event scheduler.

The program storage 502 may further include storage space (shown in FIG. 17 as free space) that may be used to store trigger subprograms. In conventional emulators, triggering functions are hard-wired. However, in the present embodiment arbitrary trigger subprograms may be stored and easily changed and/or linked to without having to re-map or recompile the design. The trigger subprogram may have an associated trigger function that may define a rule upon which a trigger is activated. For example, the trigger function may activate a trigger if a particular set of states in the design form a data word that is greater than (or less than) the trigger data. The trigger functions may further be arbitrarily changed without having to re-map or recompile the design. To activate the trigger, the logic analyzer subprogram may determine that a trigger function has resulted in a positive outcome (i.e., that a trigger should be activated), and may cause the instruction pointer to jump to the free space to execute the appropriate associated trigger subprogram.

While illustrative systems and methods as described herein embodying various aspects of the present invention are shown by way of example, it will be understood, of course, that the invention is not limited to these embodiments. Modifications may be made by those skilled in the art, particularly in light of the foregoing teachings. For example, each of the elements of the aforementioned embodiments may be utilized alone or in combination with elements of the other embodiments. In addition, the invention has been defined using the appended claims, however these claims are illustrative in that the invention is intended to include the elements and steps described herein in any combination or sub combination. It will also be appreciated and understood that modifications may be made without departing from the true spirit and scope of the invention.

What is claimed is:

1. A reconfigurable interconnect network comprising:
a plurality of simulation processors having a respective plurality of outputs and a respective plurality of inputs, the plurality of simulation processors configured to simulate a circuit model having a plurality of simulation events;
a reconfigurable interconnect stage having a plurality of inputs configured to connect to the plurality of outputs from the simulation processors and further having a plurality of outputs configured to connect to the plurality of inputs of the simulation processors; and
memory, wherein the reconfigurable interconnect network is configured to dynamically re-configure the reconfigurable interconnect stage to a plurality of configurations, each of the plurality of configurations being determined in accordance with respective content stored in the memory, each of the plurality of configurations representing a portion of the circuit model, and each re-configuring to each of the plurality of configurations being in response to one of the plurality of simulation events occurring during simulation of the circuit model, the occurrence of at least one of the simulation events being a simulated asynchronous event determined as a result of simulating the circuit model.

2. The reconfigurable interconnect network of claim 1, wherein the plurality of processor elements are configured to simulate different logic functions according to each of the plurality of simulation events.

3. The reconfigurable interconnect network of claim 1, wherein the plurality of simulation processors are configured to execute an instruction to perform a simulation of a logic function, the instruction comprising wait data reflecting a time to wait before executing a next instruction.

4. The reconfigurable interconnect network of claim 1, wherein the plurality of simulation events includes simulated synchronous events and the simulated asynchronous event occurring during simulation of the circuit model on the reconfigurable interconnect network.

5. A method comprising:
configuring a reconfigurable interconnect network to simulate a first logic function in response to a first scheduled event;
executing the first logic function on the reconfigurable interconnect network;
determining if an asynchronous event exists;
if the asynchronous event is determined to exist:
configuring the reconfigurable interconnect network to simulate a third logic function, and
executing the third logic function on the reconfigurable interconnect network; and
if the asynchronous event is determined not to exist:
configuring the reconfigurable interconnect network to simulate a second logic function in response to a second scheduled event, and
executing the second logic function on the reconfigurable interconnect network;
wherein the first logic function, second logic function, and third logic function simulate different partitions of a circuit design model, and wherein the first scheduled event, asynchronous event, and second scheduled event reflect simulated signal states in the circuit design model.

6. The method of claim 5:
wherein determining if an asynchronous event exist comprises determining if a predefined rule applied to a state of the circuit design model has a positive outcome.

7. The method of claim 5, wherein the first and second scheduled events include events of multiple different clocks of the circuit design model.

8. The method of claim 5, wherein outputs of the first logic function, second logic function, and third logic function propagate to a common simulated data path of the circuit design model.

9. A method comprising:
configuring a reconfigurable interconnect network to simulate a first logic partition of a circuit design model;
simulating the first logic partition of the circuit design model on the reconfigurable interconnect network;
configuring the reconfigurable interconnect network to simulate a second logic partition of a circuit design model; and
simulating the second logic partition of the circuit design model on the reconfigurable interconnect network,
wherein the reconfigurable interconnect network comprises a plurality of simulation processors having a respective plurality of outputs and a respective plurality of inputs, and a reconfigurable interconnect stage having a plurality of inputs configured to connect to the plurality of outputs from the simulation processors, the reconfigurable interconnect stage further having a plurality of outputs configured to connect to the plurality of inputs of the simulation processors;
wherein the configuring the reconfigurable interconnect network to simulate the first and the second logic partitions of the circuit design model comprises dynamically re-configuring the reconfigurable interconnect stage to a first configuration and a second configuration respectively; and
wherein the dynamically reconfiguring the reconfigurable interconnect stage to the second configuration is in response to an asynchronous event occurring as an output of the simulation of the first partition of the circuit design model.

10. The method of claim 9:
wherein simulating the first the second logic partitions of the circuit design model comprises executing a first instruction sequence and a second instruction sequence respectively.

11. The method of claim 9, wherein dynamically reconfiguring the reconfigurable interconnect stage to the first configuration is in response to a scheduled clock event occurring in a simulation of a third logic partition of the circuit design model.

12. The method of claim 9, wherein the asynchronous event is included in a sequence of events of the circuit design model, the sequence of events further including simulated synchronous events of the circuit design model.

13. One or more computer readable memory storing computer executable instructions that, when executed, cause a system to perform:
configuring a reconfigurable interconnect network to simulate a first logic function in response to a first scheduled event;
executing the first logic function on the reconfigurable interconnect network;
determining if an asynchronous event exists;
if the asynchronous event is determined to exist:
configuring the reconfigurable interconnect network to simulate a third logic function, and
executing the third logic function on the reconfigurable interconnect network; and
if the asynchronous event is determined not to exist:
configuring the reconfigurable interconnect network to simulate a second logic function in response to a second scheduled event, and
executing the second logic function on the reconfigurable interconnect network;
wherein the first logic function, second logic function, and third Logic function simulate different partitions of a circuit design model, and wherein the first scheduled event, asynchronous event, and second scheduled event reflect simulated signal states in the circuit design model.

14. The computer readable memory of claim 13:
wherein determining if an asynchronous event exist comprises determining if a predefined rule applied to a state of the circuit design model has a positive outcome.

15. The computer readable memory of claim 13, wherein the first and second scheduled events include events of multiple different clocks of the circuit design model.

16. The computer readable memory of claim 13, wherein the first and second scheduled events and the asynchronous event cause changes in states of data paths of the circuit design model.

17. One or more computer readable memory storing computer executable instructions that, when executed, cause a system to perform:
configuring a reconfigurable interconnect network to simulate a first logic partition of a circuit design model;
simulating the first logic partition of the circuit design model on the reconfigurable interconnect network;
configuring the reconfigurable interconnect network to simulate a second logic partition of a circuit design model; and
simulating the second logic partition of the circuit design model on the reconfigurable interconnect network, wherein the reconfigurable interconnect network comprises a plurality of simulation processors having a respective plurality of outputs and a respective plurality of inputs, and a reconfigurable interconnect stage having a plurality of inputs configured to connect to the plurality of outputs from the simulation processors, the reconfigurable interconnect stage further having a plurality of outputs configured to connect to the plurality of inputs of the simulation processors; and wherein the configuring the reconfigurable interconnect network to simulate the first and the second logic partitions comprises dynamically re-configuring the reconfigurable interconnect stage to a first configuration and a second configuration respectively, and wherein the dynamically reconfiguring the reconfigurable interconnect stage to the second configuration is in response to an asynchronous event occurring as an output of the simulation of the first partition of the circuit design model.

18. The computer readable memory of claim 17: wherein simulating the first the second logic partitions of the circuit design model comprises executing a first instruction sequence and a second instruction sequence respectively.

19. The computer readable memory of claim 17, wherein dynamically reconfiguring the reconfigurable interconnect stage to the first configuration is in response to a scheduled clock event occurring in a simulation of a third logic partition of the circuit design model.

* * * * *

UNITED STATES PATENT AND TRADEMARK OFFICE
CERTIFICATE OF CORRECTION

PATENT NO. : 8,346,530 B2  
APPLICATION NO. : 12/605622  
DATED : January 1, 2013  
INVENTOR(S) : Frederic Reblewski Page 1 of 1

It is certified that error appears in the above-identified patent and that said Letters Patent is hereby corrected as shown below:

On the Title Page, Item (56) Other Publications:
Please insert --Ken Wong et al., 'Performance Analysis and Design of a Logic Simulation Machine', International Symposium on Computer Architecture, $14^{th}$, 1987, Pittsburg, PA, pp. 46-55.--

Signed and Sealed this
Twenty-second Day of July, 2014

Michelle K. Lee
*Deputy Director of the United States Patent and Trademark Office*